Oct. 20, 1970 W. M. MOORE 3,535,595

UNIVERSAL CORD-WOOD MODULE

Filed Nov. 9, 1967

INVENTOR.
WALTER M. MOORE

BY [signature]

AGENT

United States Patent Office 3,535,595
Patented Oct. 20, 1970

3,535,595

UNIVERSAL CORD-WOOD MODULE

Walter M. Moore, Saugerties, N.Y., assignor to Ferroxcube Corporation, Saugerties, N.Y., a corporation of Delaware Filed Nov. 9, 1967, Ser. No. 681,851
Int. Cl. H05k *1/18, 3/32*
U.S. Cl. 317—101 5 Claims

ABSTRACT OF THE DISCLOSURE

A cord-wood module of the type used in logic circuits for computer memory systems. A pair of identical printed circuit boards each having a plurality of distinct diagonal parallel circuit paths thereon are positioned in overlying spaced relationship with the circuit paths being aligned normally to one another. Discrete electrical components interconnect the circuit on each of the boards. The module is usable with a multiplicity of circuits.

This invention relates to cord-wood modules utilizing printed circuit boards of the type used in logic circuits of computer memory systems.

Cord-wood modules, modules including a pair of circuit boards in parallel spaced relation interconnected by discrete electronic components, are well known. Computer memory systems incorporate great numbers of these modules with each module providing a particular logic circuit. A typical module will have a pair of printed circuit boards designed for a particular circuit. Often, the individual printed circuit boards in a module are distinct. Thus, design, fabrication, and cataloging of the numerous modules is both time consuming and expensive.

Accordingly, it is an object of the present invention to provide a cord-wood module in which a great variety of electrical components can be connected to form a multiplicity of circuits.

It is a further object of the invention to use identical printed circuit boards as both the upper and the lower boards of a cord-wood module.

According to the invention, a cord-wood module having a pair of identical printed circuit boards is provided which is usable with a multiplicity of circuits. Each of the printed circuit boards has a plurality of parallel diagonal circuit paths printed thereon. A plurality of holes are located on a rectangular coordinate pattern on the circuit board. Each of the holes passes through the board and the printed circuit path and serves as a connection point for the lead wires of electronic components to be mounted on the board. The printed circuit paths on the respective boards are aligned in normal relationship to one another. The hole patterns of the boards are in aligned relationship. Discrete electrical components interconnect the circuit paths to form a single circuit or a plurality of circuits An infinite number of circuits can be fabricated using a printed circuit module according to this invention.

The invention will be described in greater detail with reference to a preferred embodiment thereof illustrated in the accompanying drawing, in which.

Figure 1:
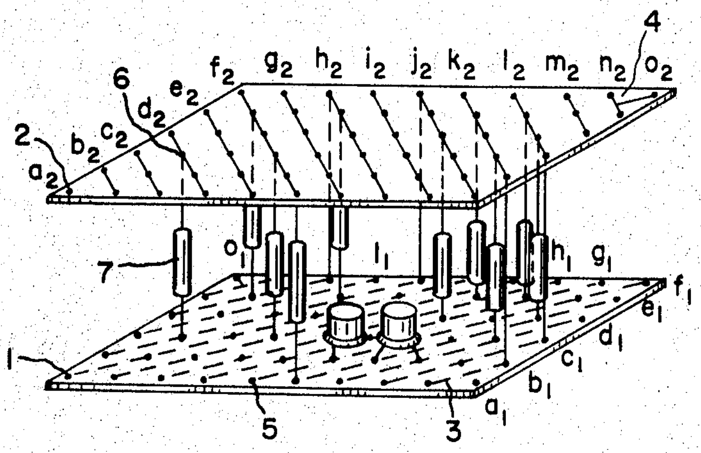
FIG. 1 is a perspective view of a cord-wood module in accordance with the instant invention.

A universal cord-wood module is shown in FIG. 1. The module includes two identical rectangular printed circuit boards 1 and 2. The circuit board material utilized in the illustrated embodiment is epoxy resin. A plurality of circuit paths on each board 1 and 2 are identified by the reference characters 3 and 4 respectively. The circuit paths are printed on the boards in a conventional manner.

Circuit paths 3 and 4 each include a series of parallel 45° diagonal conducting paths *a–o*. The conducting paths are equally spaced and each path is distinct from the adjacent path. However, as a matter of choice the corner paths may be interconnected. A pattern of holes 5 and 6 are located on each of the boards. Each hole passes through a printed circuit board and a circuit path. The holes are located on a rectangular coordinate pattern with the distance between two adjacent holes on the diagonal circuit path being equal to twice the distance between adjacent circuit paths. The holes through the circuit boards provide connection points for the lead wires emanating from the electrical components 7. A typical lead passes through the hole and is supported by the circuit board. The portion of the lead adjacent to the path is soldered thereto in a conventional manner. The correlation between the hole pattern and the diagonal circuit paths provides the universality to the module as will be described hereinafter.

The printed circuit boards 1 and 2 are placed in spaced relationship to one another with the paths $a_1$–$o_1$ of printed circuit board 1 being normally aligned with the paths $a_2$–$o_2$ of printed circuit board 2, with the hole patterns of the printed circuit boards being in overlying aligned relationship. Discrete electronic components are interconnected between the conducting paths on to the circuit boards to define a single circuit or a plurality of circuits depending on the requirements for the particular circuit.

By interconnecting components between the printed circuit boards and using the normal relationship between the paths, an infinite number of circuits can be assembled using the universal cord-wood module. Hence, utilization of the universal cord-wood module eliminates the need for fabricating special printed circuit boards for each circuit design.

Figure 2:
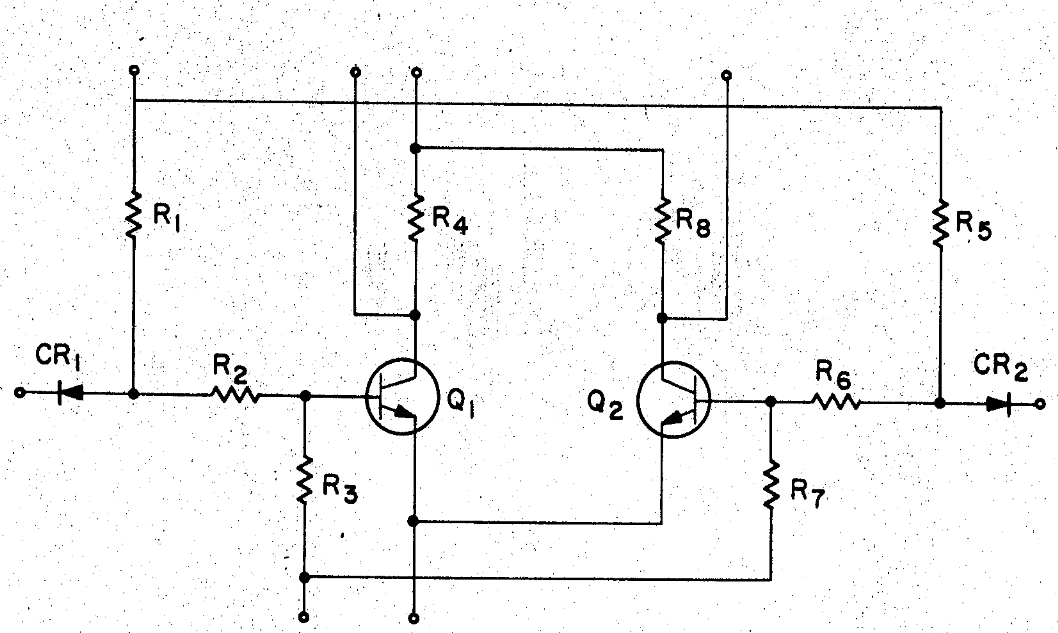
FIG. 2 is a typical circuit utilized in the cord-module of FIG. 1.

FIG. 2 is a schematic diagram of a Nand gate logic circuit used in a computer. The circuit is illustrative of the type circuit incorporated in a module. According to the prior techniques, a specially designed pair of printed circuit boards for a module would be fabricated which were particularly adapted to the circuit. A contact would be provided for every lead and a conductive path would be provided between the contacts to be interconnected. A module according to the present invention will receive the components without requiring special printed circuitry. For example, in incorporating the illustrated Nand gate logic circuit to the module, the emitters of transistors $Q_1$ and $Q_2$ are connected to separate connections on path $f_1$ The collector of $Q_1$ is connected to path $d_1$. One lead of resistor $R_4$ is connected to path $d_1$ and the other lead to path $k_2$. Path $k_2$ overlies and normally crosses path $d_1$. The previously described hole pattern provides connections in each of the boards such that any pair of aligned connection holes are located in line with the point of intersection of overlying crossing paths. The resistor leads pass through the holes and are soldered to the respective paths. The resistor $R_4$ is thus positioned substantially normally to each of the circuit boards 1 and 2 and interconnects the conducting paths $d_1$ and $k_2$ respectively. It should be noted that the remaining electrical components interconnect the conducting paths on the circuit boards in a similar manner. The leads of $R_8$ are connected to path $k_2$ and path $h_1$. The collector of $Q_2$ is also connected to path $h_1$. The base of $Q_2$ is connected to path $g_1$ along with $R_6$ and $R_7$ which are interconnected to paths $k_2$ and $l_2$ respectively. Path $j_2$ is connected to path $k_1$ by a lead wire. One lead of $R_5$ and the anode of the $CR_2$ diode is also connected to path $k_1$. The other lead of $R_5$ is connected to path $h_2$. Path $h_2$ is connected to path $m_1$ by a wire. $R_1$ interconnects paths $m_1$ and $f_2$. The anode of the $CR_1$ diode is connected to path $f_2$ and the cathode is attached to path $i_1$. $R_3$ interconnects path $l_2$ and path $e_1$. $R_2$ interconnects path $e_1$ and path $f_2$ thereby placing $R_2$ and $R_3$ in parallel with the base of $Q_1$. Lead wires may be attached to paths $i_1$, $h_1$, $f_1$, $d_1$, $c_1$, and $b_1$, $e_2$ and $i_2$.

It is seen that an infinite number of circuit combinations can be utilized with a universal module according to the present invention since a proper choice of paths permits interconnection of all parallel and series connections. The diagonal pattern of the circuit path permits edge connection with all paths thereby permitting interconnection with external components. The board size is the limiting factor in the number of components which can be included in a particular module.

The above cited embodiment is intended as exemplary only, and while I have described my invention with a specific application and embodiment thereof, other modifications will be apparent to those skilled in the art without departing from the spirit and scope of the invention as defined by the appended claims.

What is claimed is:

1. A universal cord-wood module, comprising:

(a) first and second printed-circuit carrier boards disposed with the planes of the boards spaced and generally parallel, (b) each board having an outside surface with a plurality of distinct, equally spaced, parallel printed-circuit paths thereon and an opposite inside surface, the boards disposed with their respective inside surfaces being adjacent and the circuit paths on one board being generally perpendicular to those of the other board, (c) each board having a plurality of equally spaced apertures along each path, each two adjacent holes along a path being spaced twice the distance between two paths, the corresponding apertures of the boards being aligned, and (d) a plurality of discrete electrical components fixedly mounted on at least one board and disposed between both boards with the lead wires of each component extending through appropriate holes, and being electrically and mechanically secured to the associated circuit paths.

2. A device as defined in claim 1 wherein said boards are generally rectangular, and the parallel circuit paths are at 45° angles with respect to the rectangular edges.

3. A device as defined in claim 2 wherein each four mutually adjacent holes in one board define a parallelogram with a portion of a circuit path connecting two of these four holes being the short diagonal of the parallelogram, and a corresponding, aligned second parallelogram on the other board with a portion of another path on said other board being the long diagonal of said second parallelogram.

4. A device as defined in claim 1 wherein each board has circuit paths traversing substantially its entire outer surface.

5. A device as defined in claim 4 wherein each board has apertures along substantially the entire length of each circuit path.

References Cited

UNITED STATES PATENTS

| | | |
|---|---|---|
| 2,862,992 | 12/1958 | Franz. |
| 2,934,814 | 5/1960 | Williams et al. |
| 3,193,731 | 7/1965 | Gerlach et al. |
| 3,349,287 | 10/1967 | Johnson. |
| 3,370,351 | 2/1968 | Freehauf et al. |
| 3,375,407 | 3/1968 | Rosenstand. |

ROBERT K. SCHAEFER, Primary Examiner

J. R. SCOTT, Assistant Examiner

U.S. Cl. X.R.

174—685